(12) United States Patent
Wang

(10) Patent No.: US 6,949,479 B2
(45) Date of Patent: Sep. 27, 2005

(54) METHODS OF FORMING TRANSISTOR DEVICES

(75) Inventor: Zhongze Wang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/881,407

(22) Filed: Jun. 13, 2001

(65) Prior Publication Data

US 2002/0190268 A1 Dec. 19, 2002

(51) Int. Cl.$^7$ ............................................. H01L 21/469
(52) U.S. Cl. ........................ 438/775; 438/595; 438/769
(58) Field of Search .......................... 438/197, 591, 438/593, 595, 199, 207, 288, 296, 513, 769, 775

(56) References Cited

U.S. PATENT DOCUMENTS

| | | | |
|---|---|---|---|
| 4,651,406 A | 3/1987 | Shimizu et al. | |
| 5,254,489 A | 10/1993 | Nakata | |
| 5,464,792 A | 11/1995 | Tseng et al. | |
| 5,502,009 A | 3/1996 | Lin | |
| 5,596,218 A | 1/1997 | Soleimani et al. | |
| 5,620,908 A | 4/1997 | Inoh et al. | |
| 5,674,788 A | 10/1997 | Wristers et al. | |
| 5,716,864 A | 2/1998 | Abe | |
| 5,763,922 A | 6/1998 | Chau | |
| 5,960,302 A | 9/1999 | Ma et al. | |
| 5,962,069 A * | 10/1999 | Schindler et al. ........... | 427/226 |
| 5,972,783 A | 10/1999 | Arai et al. | |
| 5,994,749 A | 11/1999 | Oda | |
| 6,093,661 A | 7/2000 | Trivedi et al. | |
| 6,136,654 A | 10/2000 | Kraft et al. | |
| 6,153,538 A | 11/2000 | An | |
| 6,165,846 A | 12/2000 | Carns et al. | |
| 6,200,834 B1 | 3/2001 | Bronner et al. | |
| 6,225,151 B1 | 5/2001 | Gardner et al. | |
| 6,342,754 B1 * | 1/2002 | Kuroda et al. ............... | 313/292 |
| 6,417,546 B2 | 7/2002 | Trivedi et al. | |
| 6,436,771 B1 * | 8/2002 | Jang et al. .................. | 438/275 |
| 6,436,845 B1 * | 8/2002 | Kamath et al. ............. | 438/769 |
| 6,492,681 B2 * | 12/2002 | Koyama et al. ............ | 257/347 |
| 6,566,281 B1 * | 5/2003 | Buchanan et al. .......... | 438/786 |
| 6,756,635 B2 * | 6/2004 | Yasuda et al. .............. | 257/325 |

FOREIGN PATENT DOCUMENTS

| | | |
|---|---|---|
| JP | 06302813 A | 4/1993 |
| JP | 326352 | 11/2001 |
| WO | WO 96/39713 | 12/1996 |

OTHER PUBLICATIONS

Wolf, Stanley, Ph.D., "Silicon Processing for the VLSI Era", vol. 2: Process Integration, Lattice Press 1990, pp. 348–363.

Doyle et al., "Simultaneous Growth of Different Thickness Gate Oxides in Silicon CMOS Processing", IEEE Electron Device Letters, vol. 16, No. 7.

Ko et al., "The Effect of Nitrogen Incorporation Into the Gate Oxide by Using Shallow Implantation of Nitrogen and Drive–in Process", 1998 IEEE, 0–7803–4932–6/98.

C.T. Liu et al; "Multiple Gate Oxide Thickness for 2GHz System–on–a–Chip Technologies"; IEEE 1998; pp. 21.2.1–21.2.4.

* cited by examiner

Primary Examiner—Amir Zarabian
Assistant Examiner—Pamlea E Perkins
(74) Attorney, Agent, or Firm—Wells St. John P.S.

(57) ABSTRACT

The invention includes a method of forming a transistor device. A semiconductor substrate is provided. The substrate has a silicon-comprising surface. The silicon-comprising surface is exposed to activated nitrogen for a time of at least about 20 seconds to convert the silicon-comprising surface to a material comprising silicon and nitrogen. The activated nitrogen is formed by exposing a nitrogen-containing precursor to a plasma generated at a power of at least about 750 watts. A transistor gate structure is formed over the material comprising silicon and nitrogen. The transistor gate structure defines a channel region underlying it. The material comprising silicon and nitrogen separates the transistor gate structure from the channel region. A pair of source/drain regions are formed which are separated from one another by the channel region.

15 Claims, 6 Drawing Sheets

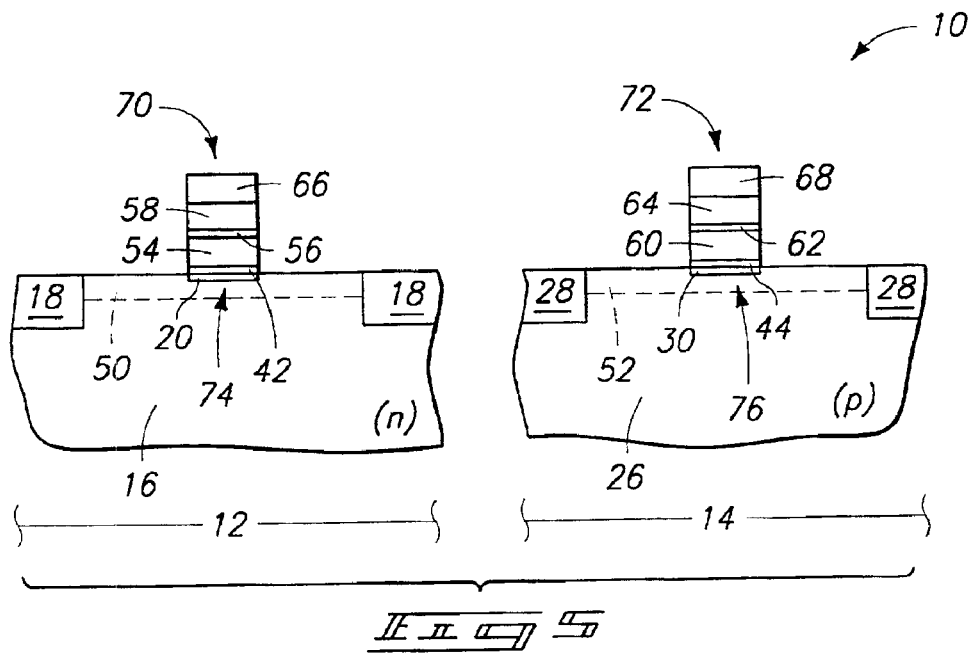
$\mathbb{F}_{I} = \mathbb{F}_{I}$ 5
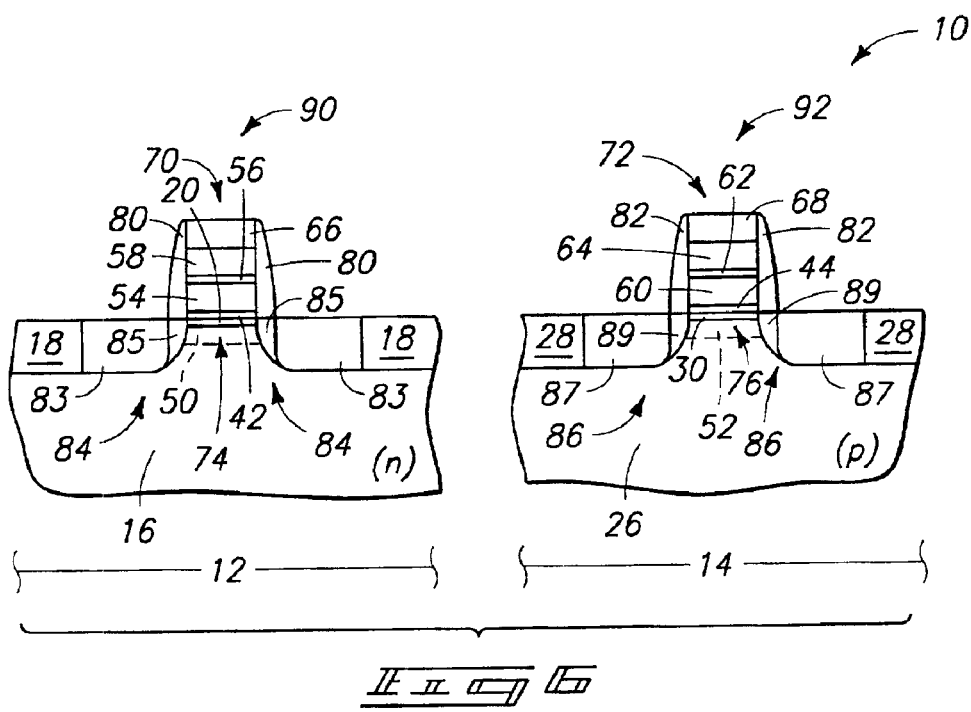
$\mathbb{F}_{I} = \mathbb{F}_{I}$ 6

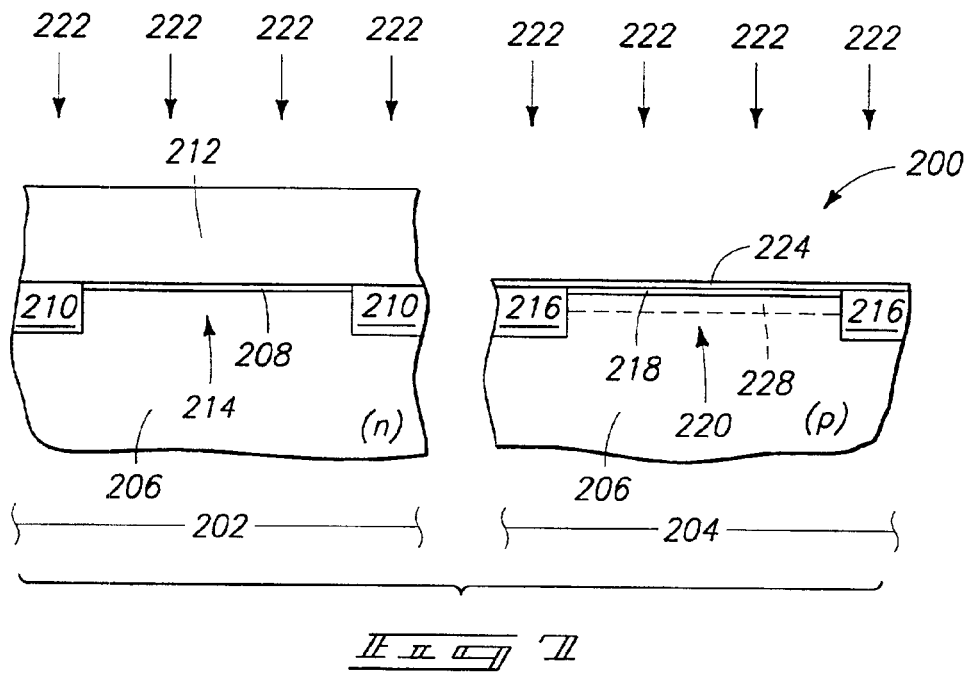
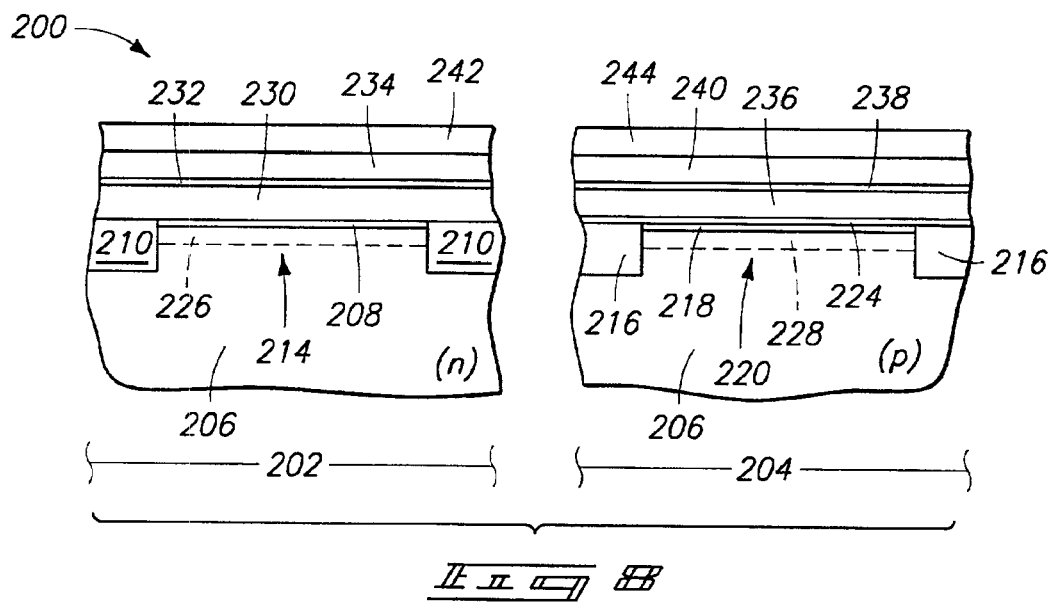

METHODS OF FORMING TRANSISTOR DEVICES

TECHNICAL FIELD

The invention pertains to methods of forming transistor devices for semiconductor constructions.

BACKGROUND OF THE INVENTION

There are numerous applications for transistor devices in semiconductor constructions. For instance, transistor devices can be incorporated into memory array constructions, as well as into logic constructions.

A typical transistor device will comprise a transistor gate over El semiconductor substrate. The transistor gate will comprise a conductive material, such as, for example, conductively doped polysilicon, and can further comprise metal silicide and/or metal over the conductively doped silicon. The transistor gate will be separated from the semiconductive material substrate by a thin layer of dielectric material. The dielectric material can comprise, for example, silicon dioxide (a so-called gate oxide). Alternatively, the dielectric material can comprise a combination of silicon dioxide and a nitrogen-containing layer formed over the silicon dioxide. The nitrogen-containing layer can be provided to alleviate or prevent dopant diffusion from the conductively-doped silicon of the transistor gate to the underlying semiconductive material substrate, such as, for example, to prevent diffusion of boron.

One exemplary method of forming the nitrogen-containing layer of the dielectric material is to expose an underlying silicon dioxide material to activated nitrogen. The activated nitrogen can be formed by exposing a nitrogen precursor (such as, for example, $N_2$) to a plasma generated at a power which is less than 1,500 watts, for a processing time of no greater than 20 seconds. The relatively low power and processing time duration are utilized because such are found to be sufficient for forming a suitable nitrogen-comprising layer for utilization as a dopant-migration barrier. Accordingly, it would be a waste of energy and processing time to extend the power and the duration of the nitrogen treatment.

In addition to the gate and dielectric layer discussed above, a transistor device will comprise a channel region within the semiconductor substrate under the transistor gate, and a pair of source/drain regions separated from one another by the channel region. The source/drain regions are selectively electrically connectable through the gate of the transistor device.

Transistor devices can be divided amongst two broad categories. One type of device comprises n-type conductively doped source/drain regions and is referred to as an NMOS device (with NMOS being an abbreviation for n-type metal-oxide-silicon), and the other type of device comprises p-type conductively doped source/drain regions and is referred to as a PMOS device (with PMOS standing for p-type metal-oxide-silicon). Logic circuitry can comprise combinations of NMOS and PMOS devices in so-called CMOS arrangements.

Among the difficulties in forming various transistors, and particularly in forming deep sub-micron PMOS transistors, is that the channel region must generally be doped with a threshold voltage ($V_t$) adjustment implant, to a concentration greater than $7\times10^{17}$ atoms/cm$^3$ to achieve a reasonable $V_t$ value. It would be desirable to lower the $V_t$ implant concentration, as lower dopant concentrations in a PMOS channel can lead to higher drive currents for the channel, higher mobility within the channel, and lower source and drain junction capacitance. Further, the lower junction capacitance can result in lower source and drain junction leakage within a device.

SUMMARY OF THE INVENTION

In one aspect, the invention encompasses a method of forming a transistor device. A semiconductor substrate is provided. The substrate has a silicon-comprising surface. The silicon-comprising surface is exposed to activated nitrogen for a time of at least about 20 seconds to convert the silicon-comprising surface to a material comprising silicon and nitrogen. The activated nitrogen is formed by exposing a nitrogen-containing precursor to a plasma generated at a power of at least about 1500 watts. A transistor gate structure is formed over the material comprising silicon and nitrogen. The transistor gate structure defines a channel region underlying it. The material comprising silicon and nitrogen separates the transistor gate structure from the channel region. A pair of source/drain regions are formed which are separated from one another by the channel region. The material comprising silicon and nitrogen preferably contains a peak nitrogen concentration of at least about 15 atom %.

In another aspect, the invention encompasses a method of forming a plurality of transistor devices. A semiconductor substrate having a silicon-comprising surface is provided. A plurality of transistor device channel region locations are defined beneath the silicon-comprising surface. The channel region locations are divided amongst two defined groups, with one of the defined groups being a first group and the other being a second group. The silicon-comprising surface over the second group of transistor device channel region locations is covered with a masking material. The silicon-comprising surface over the first group of transistor device channel region locations is exposed to activated nitrogen for a time of at least about 20 seconds to convert the silicon-comprising surface to a material comprising silicon and nitrogen. The masking material remains over the second group of transistor device channel region locations while the silicon-comprising surface over the first group of transistor device channel region locations is exposed to the activated nitrogen. Subsequently, the masking material is removed and transistor gate structures are formed over the groups of transistor device channel region locations. A plurality of source/drain regions are formed, with individual pairs of the source/drain regions being separated from one another by individual channel region locations.

BRIEF DESCRIPTION OF THE DRAWINGS

Preferred embodiments of the invention are described below with reference to the following accompanying drawings.

FIG. 5 is a view of the FIG. 1 fragments shown at a processing step subsequent to that of FIG. 4.

FIG. 6 is a view of the FIG. 1 fragments shown at a processing step subsequent to that of FIG. 5.

FIG. 7 is a view of a pair of semiconductor wafer fragments shown at a preliminary processing step of a second method of the invention.

FIG. 8 is a view of the FIG. 7 fragments shown at a processing step subsequent to that of FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
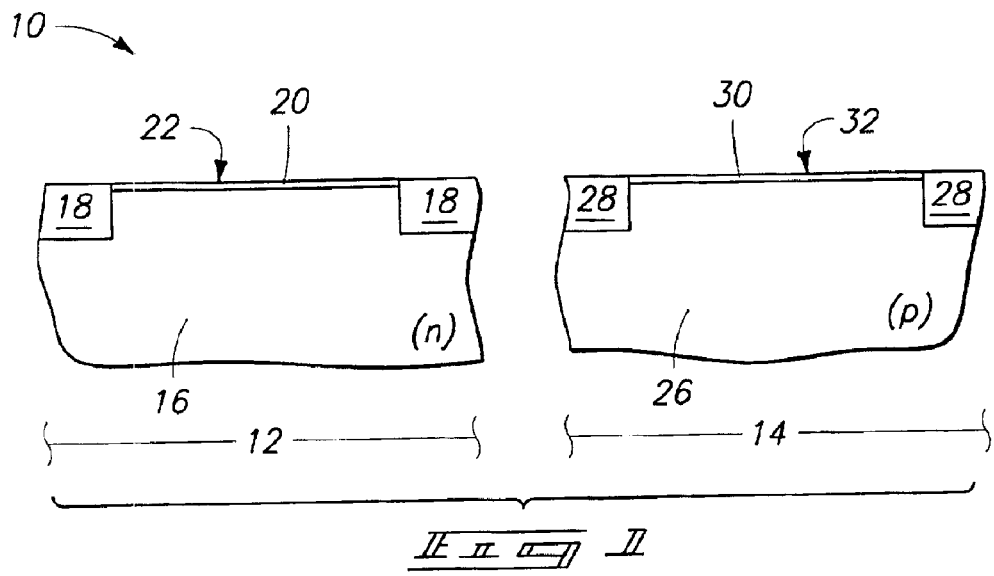
FIG. 1 is a diagrammatic, cross-sectional view of a pair of fragments of a semiconductor construction shown at a preliminary processing step of a method of the present invention.

A first embodiment of the invention is described with reference to FIGS. 1–6. Referring to FIG. 1, a pair of fragments of a semiconductor construction 10 are illustrated. Such fragments are labeled as 12 and 14. Referring initially to fragment 12, such comprises a semiconductive material substrate 16 doped to n-type with conductivity-enhancing dopant. Substrate 16 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of isolation regions 18 are formed within substrate 16, and can be formed utilizing, for example, shallow trench isolation methodologies. A layer 20 of silicon dioxide is formed across an upper surface of substrate 16. Layer 20 has an upper surface 22 which can be referred to herein as a first silicon-comprising surface.

Referring next to fragment 14, such comprises a substrate 26. Substrate 26 can comprise the monocrystalline silicon material of substrate 16, but is doped to a p-type with conductivity-enhancing dopant. A pair of isolation regions 28 are formed over substrate 26, and a silicon dioxide layer 30 is formed across an upper surface of substrate 26 between the isolation regions 28. Isolation regions 28 and silicon dioxide layer 30 can comprise identical constructions to those discussed previously with respect to isolation regions 18 and silicon dioxide layer 20. Silicon dioxide layer 30 has an upper surface 32 which can be referred to herein as a second silicon-comprising surface.

Fragments 12 and 14 can be utilized for forming a PMOS transistor structure and an NMOS transistor structure, respectively; and can ultimately be incorporated into a CMOS assembly.

Figure 2:
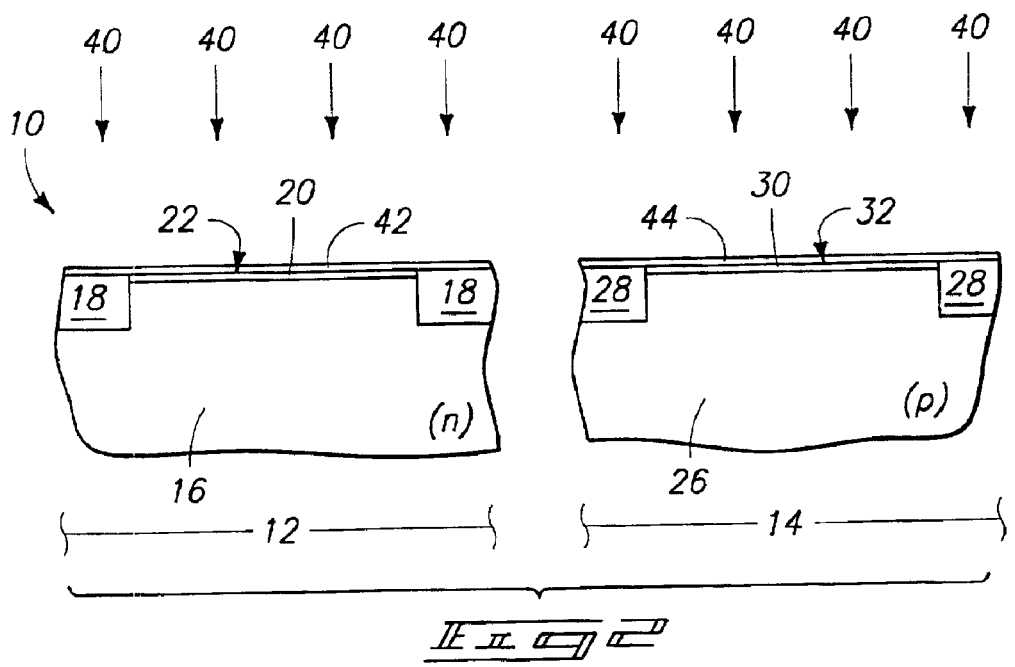
FIG. 2 is a view of the FIG. 1 fragments shown at a processing step subsequent to that of FIG. 1.

Referring to FIG. 2, surfaces 22 and 32 are exposed to activated nitrogen 40 to form nitrogen-comprising layers 42 and 44. Specifically, the activated nitrogen 40 can interact with silicon of the silicon-comprising surfaces to form a new material comprising silicon and nitrogen which defines layers 42 and 44. If silicon-comprising surfaces 22 and 32 initially comprise silicon dioxide, layers 42 and 44 can comprise compositions of silicon, oxygen and nitrogen. It is noted that the invention encompasses embodiments (not shown) wherein silicon dioxide layer 20 is omitted, and wherein an upper surface of substrate 16 is exposed to the activated nitrogen. If substrate 16 consists of or consists essentially of silicon, the nitrogen-containing layer formed from an upper surface of substrate 16 can comprise, consist of or consist essentially of silicon nitride.

Layers 42 and 44 are preferably formed to a thickness of from about 5 Å to about 10 Å. The layers are formed by exposing surfaces 22 and 32 to the activated nitrogen 40 for a desired power/time combination. Such power/time combination preferably includes a time of at least about 20 seconds; with the preferred time being from about 20 seconds to about 5 minutes; and a more preferred time being at least about 40 seconds. The activated nitrogen 40 is formed by exposing a nitrogen precursor (such as, for example, $N_2$) to a plasma maintained at a power of the power/time combination of at least about 1,500 watts, and preferably of from about 750 watts to about 5,000 watts. Surfaces 22 and 32 are preferably maintained at temperatures of from about 25° C. to about 400° C. during the exposure of such surfaces to the activated nitrogen. Such can be accomplished by maintaining an entirety of wafer 10 at the desired temperature of from about 25° C. to about 400° C. during the exposure of surfaces 22 and 32 to the activated nitrogen. The activated nitrogen treatment can occur in a reaction chamber, with a pressure in the chamber being maintained at from about 1 mTorr to about 1 Torr during the treatment. The activated nitrogen treatment can be followed by an anneal at, for example, about 900° C. for a time of from about 10 seconds to about two minutes, an preferably for about 60 seconds. The anneal temperature can be attained through rapid thermal processing (RTP) with a ramp rate of at least about 10° C./sec.

The activated nitrogen utilized in methodology of the present invention is formed by exposing surfaces 22 and 32 to high-power generated activated nitrogen for longer durations than occur in prior art processes. It is noted that the combination of power and duration separates activated nitrogen exposure of the present invention from prior art processes. Specifically, if a low-power generated activated nitrogen species is utilized for a long duration exposure, such can be substantially equivalent to utilization of a high-power generated activated nitrogen species for a short duration exposure. However, the present invention utilizes high-power generated activated nitrogen in combination with a long duration exposure to preferably form a peak nitrogen concentration of at least about 15%; which far exceeds the nitrogen concentration utilized to in prior art processes prevent dopant (e.g., boron) penetration. The present invention is thus different than the prior art processes that have been utilized for forming dielectric materials of transistor gates to prevent dopant penetration. The combination of the high power plasma generation of activated nitrogen together with the long duration exposure of surfaces 22 and 32 to the activated nitrogen forms a nitrogen-containing layer 42 which is suitable for a desired purpose of reducing a dopant concentration of a $V_t$ implant for a PMOS device. Prior art processing did not utilize the high plasma power in combination with the long-duration exposure of the present invention because the prior art was attempting to obtain a different result from the silicon/nitrogen-containing layers formed by such methodologies. Accordingly, the present methodologies were not considered appropriate for the prior art purposes described in the "Background" section of this disclosure.

Figure 10:
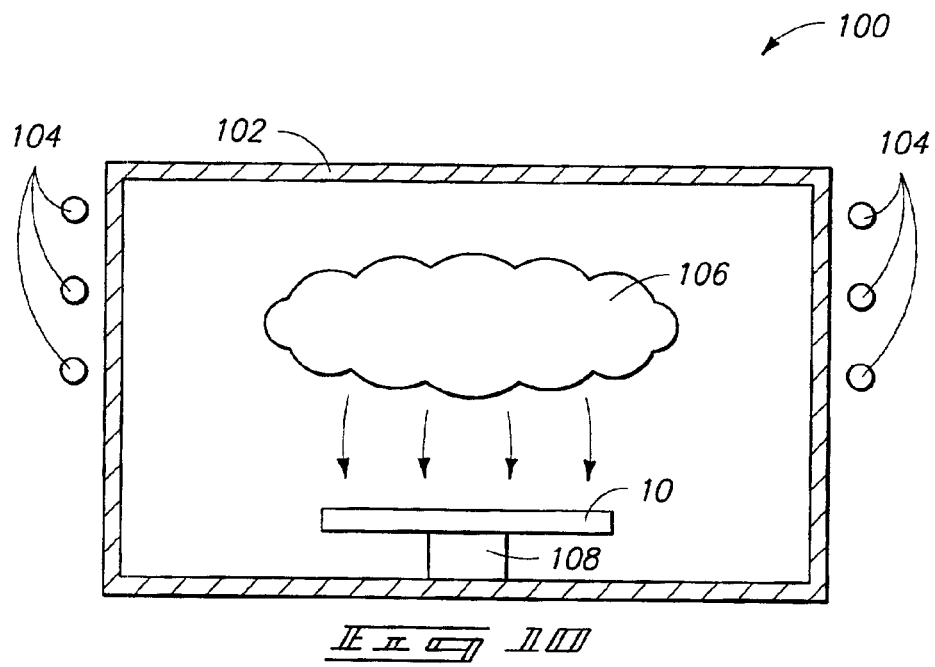
FIG. 10 is a diagrammatic, cross-sectional view of an apparatus which can be utilized for treating a semiconductor construction in accordance with an embodiment of the present invention.
Figure 11:
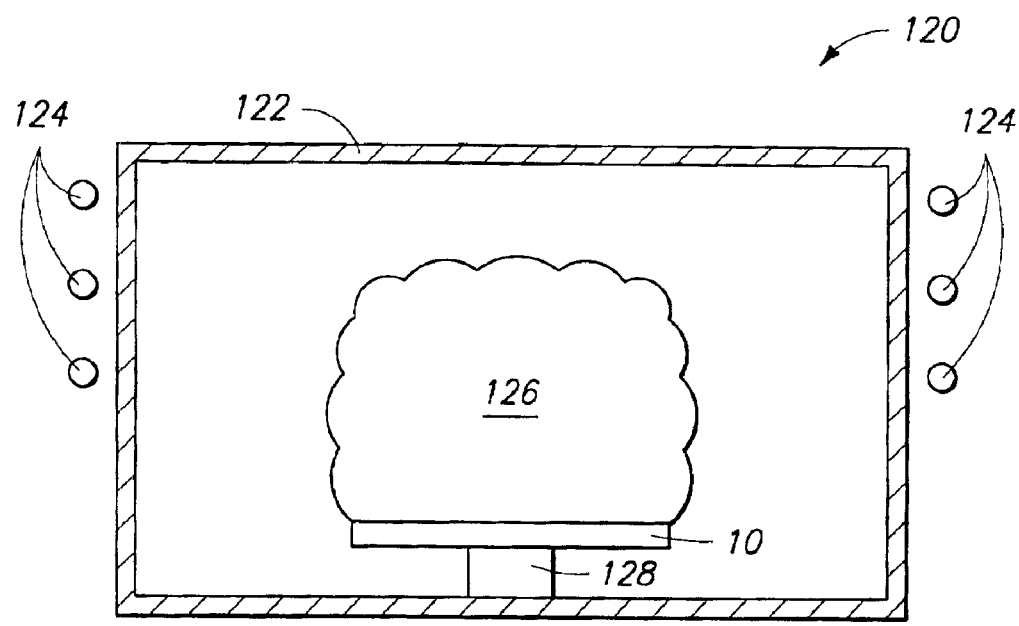
FIG. 11 is a view of an apparatus which can be utilized for treating a semiconductor construction in accordance with an embodiment of the present invention different from the embodiment illustrated in FIG. 10.

FIGS. 10 and 11 diagrammatically illustrate processing which can be utilized for generating and utilizing the activated nitrogen species 40. It is to be understood that other processing, and other reaction chambers besides the designs illustrated in FIGS. 10 and 11 can be utilized in embodiments of the present invention.

Referring initially to FIG. 10, such illustrates an apparatus 100 comprising a reaction chamber 102 surrounded by coils 104. Coils 104 are ultimately utilized for providing power within chamber 102 to maintain a plasma 106. Coils 104 can, for example, be utilized to provide radio frequency (Rf) power.

Wafer 10 is illustrated supported upon a holder 108. A cooling mechanism (not shown) can be provided to cool a back surface of wafer 10 and accordingly hold the upper (treated) surface of wafer 10 at the desired temperature of from about 100° C. to about 400° C. by cooling an entirety of the wafer 10.

Nitrogen-comprising precursor (such as, for example, $N_2$) is flowed into chamber 102 through appropriate ports (not shown) to form activated nitrogen. In the shown embodiment, the glow of plasma 106 is not in contact with a treated surface of wafer 10, and accordingly plasma 106 can be considered to be remote relative to the treated surface of wafer 10. Activated nitrogen exits glow 106, and some of the activated nitrogen can ultimately migrate to an upper surface of wafer 10 to treat such upper surface (with the migration of the activated nitrogen being indicated by arrows pointing downwardly from plasma 106 to wafer 10).

Referring to FIG. 11, a different embodiment apparatus 120 is illustrated diagrammatically. Apparatus 120 comprises a reaction chamber 122 surrounded by coils 124. Coils 124 can be utilized to provide power to a plasma 126. Wafer 10 is illustrated within chamber 122 and is shown supported on a holder 128. Wafer 10 can be cooled in chamber 122 by a cooling mechanism (not shown) similar to that described previously with respect to the apparatus 100.

A difference between the embodiment of FIG. 11 and that of FIG. 10 is that the plasma glow 126 of FIG. 11 contacts the treated surface of wafer 10. Accordingly, activated nitrogen species can be formed in direct contact with the treated surface of wafer 10. The process illustrated in FIG. 11 can be referred to as direct plasma nitridation, in that the activated nitrogen species can be formed in direct contact with the treated surface.

The activated nitrogen species formed within apparatus 120 can be generated by flowing a nitrogen precursor (such as, for example, $N_2$) into reaction chamber 122 through appropriate ports (not shown).

Figure 3:
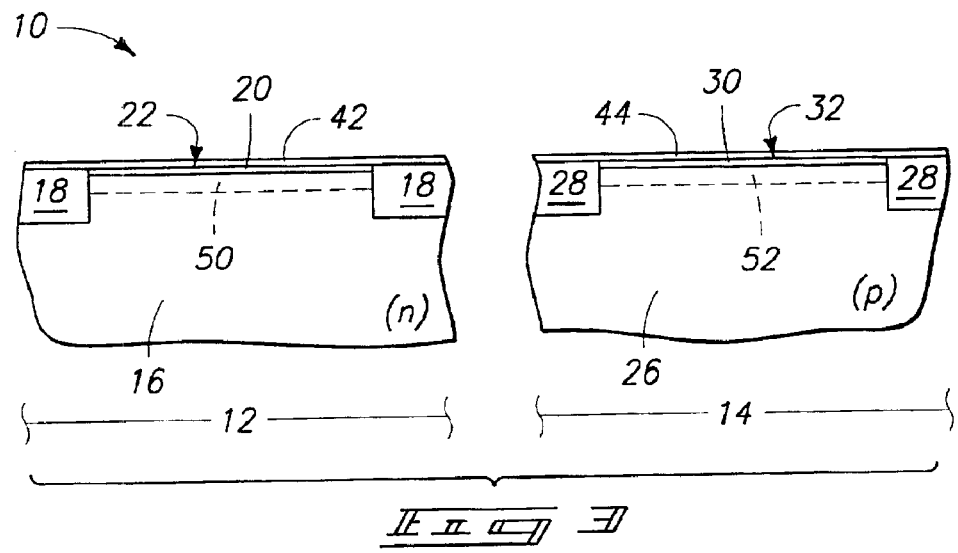
FIG. 3 is a view of the FIG. 1 fragments shown at a processing step subsequent to that of FIG. 2.

Referring to FIG. 3, wafer fragments 12 and 14 are illustrated after a $V_t$ implant has been provided at an upper surface of the substrate regions 16 and 26. The $V_t$ implant within fragment 12 is labeled as 50 and that within fragment 14 is labeled as 52. It is noted that the $V_t$ implant 52 would typically comprise different dopants and concentrations than 50; and accordingly region 14 would typically be masked during formation of implant 50, while region 12 would typically be masked during formation of implant 52. Also, it is noted that even though the $V_t$ implants are shown at the processing step of FIG. 3, it is to be understood that such implants can be formed at a different processing step, such as, for example, the processing step of FIG. 1, by implanting suitable conductivity-enhancing dopants through dielectric layers 28 and 30. In the embodiment of FIG. 3, the suitable conductivity-enhancing dopants have been implanted through dielectric materials 20 and 30, as well as through nitrogen-containing layers 42 and 44.

Implant region 50 will ultimately be incorporated into a PMOS transistor device, and can advantageously have a dopant concentration of less than $7 \times 10^{17}$ atoms/cm$^3$; preferably less than $5 \times 10^{17}$ atoms/cm$^3$; and can, for example, have the dopant concentration within a range of from about $1 \times 10^{17}$ atoms/cm$^3$ to about $7 \times 10^{17}$ atoms/cm$^3$, or a range of from about $1 \times 10^{17}$ atoms/cm$^3$ to about $5 \times 10^{17}$ atoms/cm$^3$. The utilization of the relatively low concentration of conductivity-enhancing dopant for $V_t$ implant region 50 is possible because of the nitrogen-containing layer 42. Specifically, nitrogen-containing layer 42 enables a PMOS transistor to be formed with a lower concentration $V_t$ implant, and still have the desired electrical properties which previously could be accomplished only with higher concentrations of $V_t$ implants. A possible mechanism by which the nitrogen of nitrogen-containing layer 42 reduces a desired level of dopant in a PMOS device is by affecting donor-type interface states. Such mechanism is presented herein to assist the reader in understanding the invention, and is not to be utilized in limiting the invention. Due to the expected affect of the of the nitrogen on donor-type interface states, it is also expected that the nitrogen will have little, if any, affect on the desired $V_t$ dopant concentration of an NMOS device. Such expectation is consistent with actual findings.

In the shown embodiment, the $V_t$ implant 52 is ultimately incorporated into an NMOS device, and, as mentioned above, the concentration of conductivity-enhancing dopant in such $V_t$ implant is generally largely unaffected by nitrogen-comprising layer 44. Accordingly, $V_t$ implant region 52 will have about the same concentration of conductivity-enhancing dopant as would a prior art $V_t$ implant provided for an NMOS device. Although nitrogen-comprising layer 44 has not provided advantages relative to a concentration of dopant utilized in $V_t$ implant region 52, layer 44 can provide other advantages for an NMOS device. Specifically, layer 44 can reduce an effective thickness of dielectric material required to achieve a particular dielectric strength. Specifically, nitrogen-comprising layer 44 will typically have a different dielectric constant than material 30, and accordingly the relative thicknesses of materials 30 and 44 can influence the dielectric strength of the mass comprising layers 30 and 44. Accordingly, variation of the relative thickness of layer 44 to layer 30 can be utilized as a parameter for controlling the dielectric strength of the mass comprising layers 30 and 44.

In particular embodiments, it can be desired to avoid formation of a nitrogen-comprising layer over NMOS region 14. In such embodiments, region 14 can be masked during formation of the nitrogen-comprising layer over PMOS region 12. An exemplary procedure which can be incorporated into such embodiments is described below with reference to FIGS. 7–9.

Figure 4:
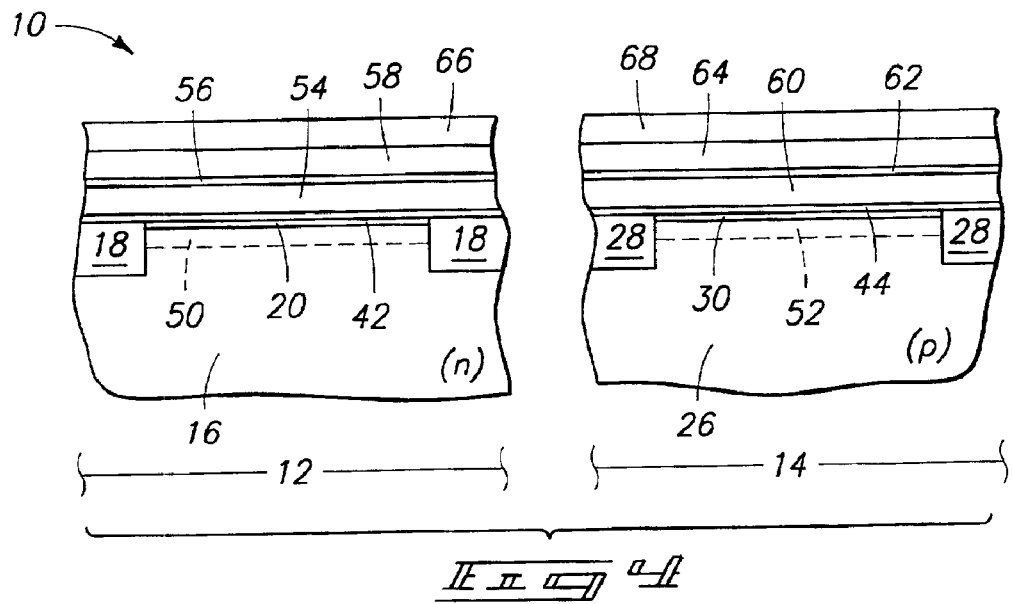
FIG. 4 is a view of the FIG. 1 fragments shown at a processing step subsequent to that of FIG. 3.

Referring to FIG. 4, conductive transistor gate materials 54, 56 and 58 are formed over region 12; and conductive gate materials 60, 62 and 64 are formed over region 14. Materials 54, 56 and 58 can comprise, for example, conductively-doped silicon (such as silicon conductively doped with p-type conductivity-enhancing dopant); metal silicide (for example, tungsten silicide or titanium silicide); and metal (for example, tungsten or titanium).

Layers 60, 62 and 64 can comprise, for example, conductively-doped silicon, silicide and metal, respectively.

Layer 60 can comprise, for example, conductively doped polycrystalline silicon, and in particular applications can comprise n-type doped silicon; silicide 62 can comprise, for example, tungsten silicide or titanium silicide; and metal 64 can comprise, for example, tungsten or titanium.

Insulative layers 66 and 68 are formed over the conductive transistor gate layers. Layers 66 and 68 can comprise, for example, silicon nitride or silicon dioxide, and in particular applications can comprise identical compositions as one another. Also, it is noted that layer 60, 62 and 64 can, in particular applications, comprise identical constructions as layers 54, 56 and 58, respectively.

Referring to FIG. 5, layers 20, 42, 54, 56, 58 and 66 are patterned into a first stack 70; and layers 30, 44, 60, 62, 64 and 68 are patterned into a second stack 72. The patterning of stacks 70 and 72 can be accomplished by, for example, forming a layer of photoresist (not shown) over layers 66 and 68; photolithographically patterning the photoresist; transferring a pattern from the photoresist to the underlying materials with a suitable etch; and subsequently removing the photoresist.

Stack 70 comprises a first transistor gate which includes patterned conductive layers 54, 56 and 58; and stack 72 comprises a second transistor gate which includes patterned conductive layers 60, 62 and 64. The first transistor gate defines a first channel region 74 thereunder, and second transistor gate defines a second channel region 76 thereunder. The transistor gates are separated from the channel regions by dielectric material. Specifically, the first transistor gate is separated from the first channel region 74 by patterned dielectric materials 20 and 42; and the second transistor gate is separated from the second channel region 76 by patterned dielectric materials 30 and 44.

Referring to FIG. 6, sidewall spacers 80 are provided laterally adjacent first stack 70; and sidewall spacers 82 are provided laterally adjacent second stack 72. Sidewall spacers 80 and 82 can be formed from, for example, either silicon nitride or silicon dioxide. The sidewall spacers can be formed by, for example, providing a layer of suitable material over wafer 10, and subsequently anisotropically etching the material to leave sidewall spacers 80 and 82 remaining.

A first pair of source/drain regions 84 are provided within substrate 16, and provided to be spaced from one another by channel region 74. Source/drain regions 84 comprise a heavily doped portion 83 and a lightly doped portion 85. Heavily doped portion 83 will be heavily doped with p-type conductivity-enhancing dopant. Regions 85 and 83 can be formed by conventional methods. A second pair of source/drain regions 86 are provided within substrate 26, and provided to be spaced from one another by channel region 76. Source/drain regions 86 comprise heavily-doped regions 87 and lightly doped regions 89. Regions 87 will be heavily doped with n-type conductivity-enhancing dopant. Regions 87 and 89 can be formed by conventional processing.

The stack 70, together with source/drain regions 84 and channel regions 74, defines a PMOS transistor construction 90; and the stack 72 together with source/drain regions 86 and channel region 76 defines an NMOS transistor construction 92.

A second embodiment method of the present invention is described with reference to FIGS. 7–9. Referring to FIG. 7, two fragments 202 and 204 of a wafer 200 are illustrated. Fragment 202 comprises a substrate 206 having a dielectric material layer 208 thereover. Substrate 206 can comprise, for example, monocrystalline silicon, and can be either majority n-type doped or majority p-type doped. A pair of isolation regions 210 are supported by substrate 206. Isolation regions 210 and dielectric layer 208 can comprise constructions identical to those described above with reference to isolation regions 18 and dielectric layer 20 of FIG. 1. A masking material 212 is formed over substrate 206, and covers an upper surface of fragment 202. Masking material 212 can comprise, for example, photoresist, and can be patterned by photolithographic processing. Fragment 202 will ultimately be utilized for formation of a transistor structure, and accordingly a first channel region location 214 is defined within substrate 206.

Fragment 204 comprises the substrate 206. The substrate 206 can be majority doped with the same dopant type in fragment 204 as utilized in fragment 202, or alternatively substrate 206 can comprise a different majority dopant type in fragment 204 than in fragment 202. In particular aspects of the present invention, substrate 206 will comprise p-type background doping in fragment 202 so that an NMOS transistor can be formed relative to fragment 202, and substrate 206 will comprise n-type background doping in fragment 204 so that a PMOS transistor can be formed relative to fragment 204. In other embodiments, substrate 206 will comprise majority n-type doping in both fragments 202 and 204 so that PMOS transistors are ultimately formed relative to both of fragments 202 and 204.

A pair of isolation regions 216 are formed relative to fragment 204, and a dielectric material 218 is formed across an upper surface of substrate 206 and between isolation regions 216. A second channel region location 220 is defined beneath dielectric material 218, and will ultimately be incorporated into a second transistor structure.

Wafer 200 is shown exposed to activated nitrogen 222. Masking layer 212 protects an upper surface of fragment 202 from the activated nitrogen, whereas an upper surface of fragment 204 is exposed to the activated nitrogen 222 to form a nitrogen-comprising layer 224 across fragment 204. Activated nitrogen 222 can be formed utilizing conditions similar to those discussed previously with reference to FIG. 2. Specifically, wafer 200 can be held at the same conditions described previously with reference to FIG. 2, and exposed to activated nitrogen 222 for the same duration of time as described previously with reference to FIG. 2.

Referring to FIG. 8, masking layer 212 (FIG. 7) is removed and $V_t$ implants 226 and 228 are formed relative to fragments 202 and 204, respectively. $V_t$ implant 228 can be different than implant 226, and can, for example, be formed while masking 212 is in place over fragment 202. Also, a separate mask (not shown) can be provided over fragment 204 while $V_t$ implant 226 is formed within fragment 202. In embodiments in which substrate 206 comprises n-type majority doping relative to both fragments 202 and 204, and accordingly wherein PMOS devices are to ultimately be formed relative to both of the fragments, $V_t$ implant 228 can be formed to a lower concentration of conductivity enhancing dopant than is $V_t$ implant 226.

Conductive transistor gate materials 230, 232 and 234 are formed relative to fragment 202; and conductive transistor gate materials 236, 238 and 240 are formed relative to fragment 204. Materials 230, 232 and 234 can comprise, for example, conductively doped silicon, metal silicide and metal, respectively; and materials 236, 238 and 240 can similarly comprise conductively doped silicon, metal silicide and metal, respectively. The conductively doped silicon layers 230 and 236 can comprise either n-type or p-type doped silicon, such as, for example, conductively doped polycrystalline silicon. The metal silicide layers 232 and 238 can comprise, for example, titanium silicide or tungsten silicide. The metal layers 234 and 240 can comprise, for example, titanium or tungsten.

If fragments 202 and 204 are both being utilized for forming PMOS transistors, the layers 230 and 236 can be identical to one another and formed in a common processing step; the layers 232 and 238 can be identical to one another and formed in the same processing step; and the layers 234 and 240 can be identical to one another and formed in the same processing step. Also, if layers 202 and 204 are to be utilized for forming a PMOS transistor and an NMOS transistor, respectively; the layers 232 and 238 can be identical and formed in the same processing step, and the layers 234 and 240 can be identical and formed in the same processing step. If layers 202 and 204 are to be utilized for forming a PMOS transistor and an NMOS transistor, respectfully; the layers 230 and 236 can be identical and formed in the same processing step, or the layers 230 and 236 can be different in comprising a different type of conductivity dopant relative to one another.

An insulative material 242 is formed over conductive material 234, and an insulative material 244 is formed over conductive material 240. Insulative materials 242 and 244 can comprise the same composition as one another, and can be formed in the same processing step. Exemplary materials for layers 242 and 244 are silicon dioxide and silicon nitride.

Figure 9:
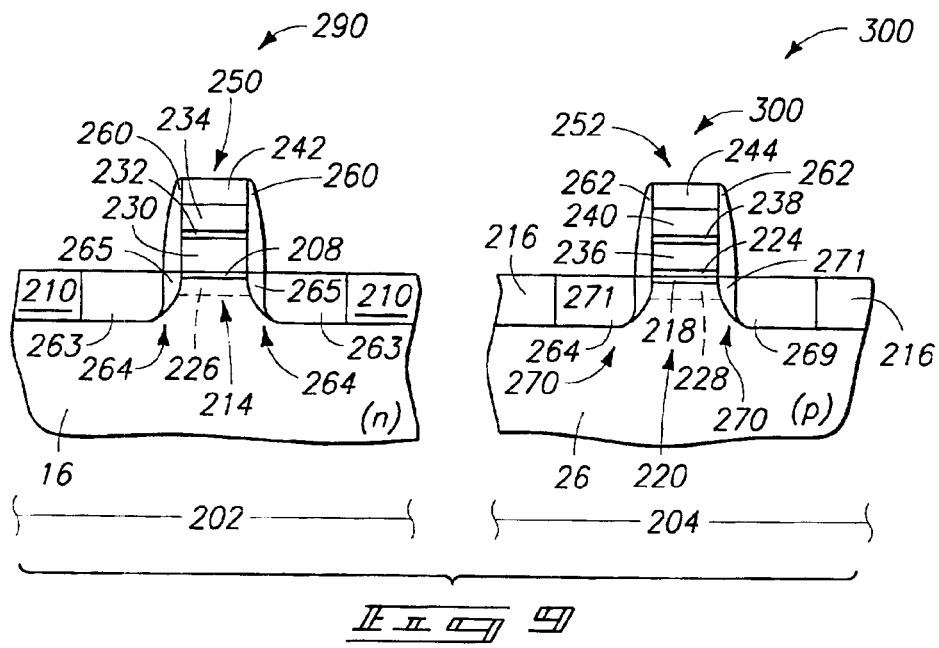
FIG. 9 is a view of the FIG. 7 fragments shown at a processing step subsequent to that of FIG. 8.

Referring to FIG. 9, layers 208, 230, 232, 234 and 242 are patterned into a stack 250; and layers 218, 224, 236, 238, 240 and 244 are patterned into a second stack 252. Stacks 250 and 252 comprise transistor gate constructions, and accordingly define channel regions therebeneath. Such channel regions are in channel region locations 214 and 220, respectively.

Sidewall spacers 260 are formed adjacent stack 250, and sidewall spacers 262 are formed adjacent stack 252. Sidewall spacers 260 and 262 can comprise constructions identical to those discussed above for sidewall spacers 80 and 82 of FIG. 6.

A pair of source/drain regions 264 are provided relative to stack 250 and spaced from one another by the channel region at location 214; and a pair of source/drain regions 270 are provided relative to stack 252 and spaced from one another by the channel region at location 220. Source/drain regions 264 comprise a heavily doped region 263 and a lightly doped region 265, whereas source/drain regions 270 comprise a heavily doped region 269 and a lightly doped region 271.

A first transistor structure 290 is defined by stack 250 in combination with source/drain regions 264; and a second transistor 300 is defined by stack 252 in combination with source/drain regions 270. In embodiments in which both of transistor structures 290 and 300 comprise PMOS transistors, the transistor construction 300 can have a different $V_t$ doping than does the transistor construction 290. Such can enable transistor structure 300 to be tailored for a different purpose than transistor structure 290. For instance, in embodiments in which transistor structures 290 and 300 are utilized for logic circuitry, it can be desirable to have one set of transistors with different operating characteristics than another set. Utilization of nitrogen-containing layer 224 in combination with tailored $V_t$ doping of region 228 can enable transistor construction 300 to be specifically tailored for suitability for different operations than transistor structure 290. In alternative embodiments in which transistor structure 290 corresponds to an NMOS transistor and transistor structure 300 corresponds to a PMOS transistor, it can be advantageous to leave the nitrogen-containing layer (224) out of the NMOS transistor construction.

Transistor constructions 290 and 300 can be considered to define two separate groups of transistor constructions, with transistor construction 290 corresponding to a group which is covered during formation of the nitrogen-comprising layer (224), and which accordingly does not comprise such nitrogen-comprising layer. In contrast, the group corresponding to transistor construction 300 does comprise the nitrogen-comprising layer 224.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a transistor device, comprising:

exposing a substrate surface having a first peak nitrogen concentration to activated nitrogen to form an exposed surface having a second peak nitrogen concentration at least 15% (atom percent) greater than the first peak nitrogen concentration;

providing a channel region on one side of the exposed surface;

providing a transistor gate structure on a side of the exposed surface that is opposed to said one side; and forming a pair of source/drain regions separated from one another by the channel region.

2. The method of claim 1 further comprising forming a layer of silicon dioxide over the channel region, and wherein the substrate surface comprises a surface of the silicon dioxide.

3. The method of claim 1 wherein the transistor device is a PMOS device.

4. The method of claim 1 wherein the transistor device is an NMOS device.

5. The method of claim 1 further comprising heating the exposed surface to a temperature of about 900° C. for a time of from about 10 seconds to about 60 seconds, wherein the heating comprises rapid thermal processing at a temperature ramp rate of at least about 10° C./second.

6. A method of forming a transistor device, comprising:

defining a channel region of the transistor device beneath a substrate surface;

implanting a dopant into the channel region to a concentration of less than about $7 \times 10^{17}$ atoms/cm$^3$ as a $V_t$ implant;

forming a dielectric material over the channel region, the forming the dielectric material comprising exposing the substrate surface to activated nitrogen to increase a peak nitrogen concentration within the substrate surface by at least about 15 atom percent, the dielectric material comprising the exposed surface;

forming a transistor gate structure over the dielectric material; and forming a pair of source/drain regions separated from one another by the channel region.

7. The method of claim 6 further comprising forming a layer of silicon dioxide over the channel region, and wherein the substrate surface comprises the silicon dioxide.

8. The method of claim 6 wherein the transistor device is a PMOS device.

9. The method of claim 6 wherein the concentration of dopant in the $V_t$ implant is less than $7 \times 10^{17}$ atoms/cm$^3$.

10. The method of claim 6 wherein the concentration of dopant in the $V_t$ implant is from about $1 \times 10^{17}$ atoms/cm$^3$ to $7 \times 10^{17}$ atoms/cm$^3$.

11. The method of claim 6 wherein the concentration of dopant in the $V_t$ implant is from about $1 \times 10^{17}$ atoms/cm$^3$ to $5 \times 10^{17}$ atoms/cm$^3$.

12. The method of claim 6 wherein the activated nitrogen is formed from a plasma maintained at a power of from about 1,500 watts to about 5,000 watts.

13. The method of claim 6 wherein the activated nitrogen is formed from a plasma that is remote relative to the substrate surface.

14. The method of claim 6 wherein the activated nitrogen is formed from a plasma that contacts the substrate surface.

15. The method of claim 6 further comprising maintaining the substrate surface at a temperature of from about 25° C. to about 400° C. during the exposing of the substrate surface to the activated nitrogen.

* * * * *

UNITED STATES PATENT AND TRADEMARK OFFICE
CERTIFICATE OF CORRECTION

PATENT NO. : 6,949,479 B2
APPLICATION NO. : 09/881407
DATED : September 27, 2005
INVENTOR(S) : Wang It is certified that error appears in the above-identified patent and that said Letters Patent is hereby corrected as shown below:

Col. 1, line 17, delete "EI" after "over" and insert --a--.

Col. 4, line 37, delete "an" after "minutes," and insert --and--.

Signed and Sealed this

Eighth Day of August, 2006

JON W. DUDAS
*Director of the United States Patent and Trademark Office*